United States Patent [19]
Hashemi

[11] Patent Number: 5,157,581
[45] Date of Patent: Oct. 20, 1992

[54] CONDUCTIVE CERAMICS, CONDUCTORS THEREOF AND METHODS

[75] Inventor: Tooraj Hashemi, Belmont, United Kingdom

[73] Assignee: Elmwood Sensors Limited, Tyne & Wear, Great Britain

[21] Appl. No.: 573,302

[22] PCT Filed: Mar. 30, 1989

[86] PCT No.: PCT/GB89/00328
§ 371 Date: Nov. 13, 1990
§ 102(e) Date: Nov. 13, 1990

[87] PCT Pub. No.: WO89/09473
PCT Pub. Date: Oct. 5, 1989

[30] Foreign Application Priority Data

Mar. 30, 1988 [GB] United Kingdom ............... 8807609
Apr. 29, 1988 [GB] United Kingdom ............... 8810243

[51] Int. Cl.$^5$ .................. H01B 12/00; H01G 4/10
[52] U.S. Cl. .................................................. 361/321
[58] Field of Search ................ 505/1; 174/126.2; 361/321, 500; 429/194

[56] References Cited

U.S. PATENT DOCUMENTS

| | | | |
|---|---|---|---|
| 4,762,754 | 8/1988 | Nellis et al. | 505/1 |
| 4,833,050 | 5/1989 | Whitney et al. | 505/1 X |
| 4,859,652 | 8/1989 | Block | 505/1 |
| 4,962,083 | 10/1990 | Hermann et al. | 505/1 |
| 4,975,413 | 12/1990 | Statek et al. | 505/1 |
| 4,994,432 | 2/1991 | Hermann et al. | 505/1 |

FOREIGN PATENT DOCUMENTS 889061 5/1988 World Int. Prop. O.
8908846 7/1989 World Int. Prop. O.

OTHER PUBLICATIONS

Fortune, Jun. 22, 1987, 505-1, pp. 114 to 116 and 118.
I.B.M. Thomas J. Watson, Research Center, RC 12777 (#57374), May 8, 1987, 11 pages.
Nature, vol. 328, Jul. 30, 1987, pp. 403–404.

*Primary Examiner*—Donald Griffin

[57] ABSTRACT

A ceramic of known composition exhibiting superconductivity below a critical temperature is caused to exhibit superconductivity or superconductor-like behaviour at room temperature by the application of an electrochemical potential. The effect is believed to arise from an increased population of the monovalent state of copper and other methods are proposed for creating such a population without cooling.

34 Claims, 6 Drawing Sheets

CONDUCTIVE CERAMICS, CONDUCTORS THEREOF AND METHODS

BACKGROUND AND SUMMARY OF THE PRESENT INVENTION

This invention relates to electrically conductive compositions exhibiting superconductivity or superconductor-like behaviour.

It is known that certain ceramic compositions become superconductive with transition temperatures which are as high as 98K. The composition $YBa_2Cu_3O_{7-x}$, for example, exhibits this effect and has been closely studied. The mechanism by which superconductivity is achieved is not fully understood but it is believed that the appearance in the Perovskite structure of planes containing only copper and oxygen, is of critical importance. Other ceramic compositions showing this structural feature have been found to exhibit superconductivity and examples can be quoted of La-Ba-Sr-Cu-O; La-Ba-Cu-O, Bi-Sr-Ca-Cu-O and Tl-Ba-Ca-Cu-O. The attainment of superconductivity at still higher temperatures has been reported in certain compositions but the results are not readily reproduceable.

It is an object of one aspect of this invention to provide a ceramic composition exhibiting superconductivity, or superconductor-like behaviour at temperatures significantly in excess of 98K.

According to a first aspect of this invention, there is provided a ceramic material containing copper, characterised in that copper ions are maintained substantially independently of temperature in an oxidation state providing a significant population of Cu(I), the material exhibiting superconductivity or superconductor-like behaviour at temperatures in excess of 200K.

Advantageously, the material has the Perovskite structure.

Preferably, the material has a crystal structure with planes comprising substantially only copper and oxygen atoms.

In a further aspect, the present invention consists in a method for use with a composition which exhibits superconductivity below a superconducting transition temperature, characterised by the step of maintaining at least a proportion of a metallic species in the composition in a reduced state, and thereby causing the composition to exhibit superconductivity or superconductor-like behaviour at a temperature significantly in excess of the superconducting transition temperature.

Advantageously, the method comprises chemically or electrochemically reducing said metallic species.

In a still further aspect, the present invention consists in a conductor exhibiting superconductivity or superconductor-like behaviour at room temperature and comprising a ceramic composition containing a reduced metal species maintained in an environment serving to prevent or inhibit oxidation of said species.

Advantageously, the reduced metal species comprises Cu(I).

In yet a further aspect, the present invention consists in a superconductor comprising a ceramic composition being the negative electrode of an electrochemical cell.

Advantageously, the ceramic composition comprises planes containing substantially only copper and oxygen.

BRIEF DESCRIPTION OF THE DRAWINGS

This invention will now be described by way of example with reference to the accompanying drawings in which.

DETAILED DESCRIPTION OF THE PREFERRED EMBODIMENTS OF THE PRESENT INVENTION

A ceramic superconductor sample was prepared using generally known techniques. Reference is directed, for example, to "T. Hashemi, Z. T. Al-Dhaan, F. Golestani-Fard and C. A. Hogarth, Journal of Materials Science 23 4513 (1988)". Briefly, barium carbonate and yttrium and cupric oxides with stoichiometric ratios were mixed intimately and fired at 925° C. for 12 hours. Weight loss measurements showed that complete calcination occurred under these conditions. The calcined material was ground to a fine powder and pressed into pellets 12 mm in diameter and 1 mm in thickness. The samples were then fired in air at 945° C. for 20 hours followed by annealing in pure oxygen for another 36 hours, before cooling to room temperature in a controlled manner. Samples prepared in this way displayed a very good Meissner effect while their resistance fell to zero at a temperature close to that of liquid nitrogen.

In accordance with this invention, a sample thus prepared was subjected to an electrochemical potential at room temperature and exhibited a drop in resistance to a value which was zero or close to zero.

Figure 1:
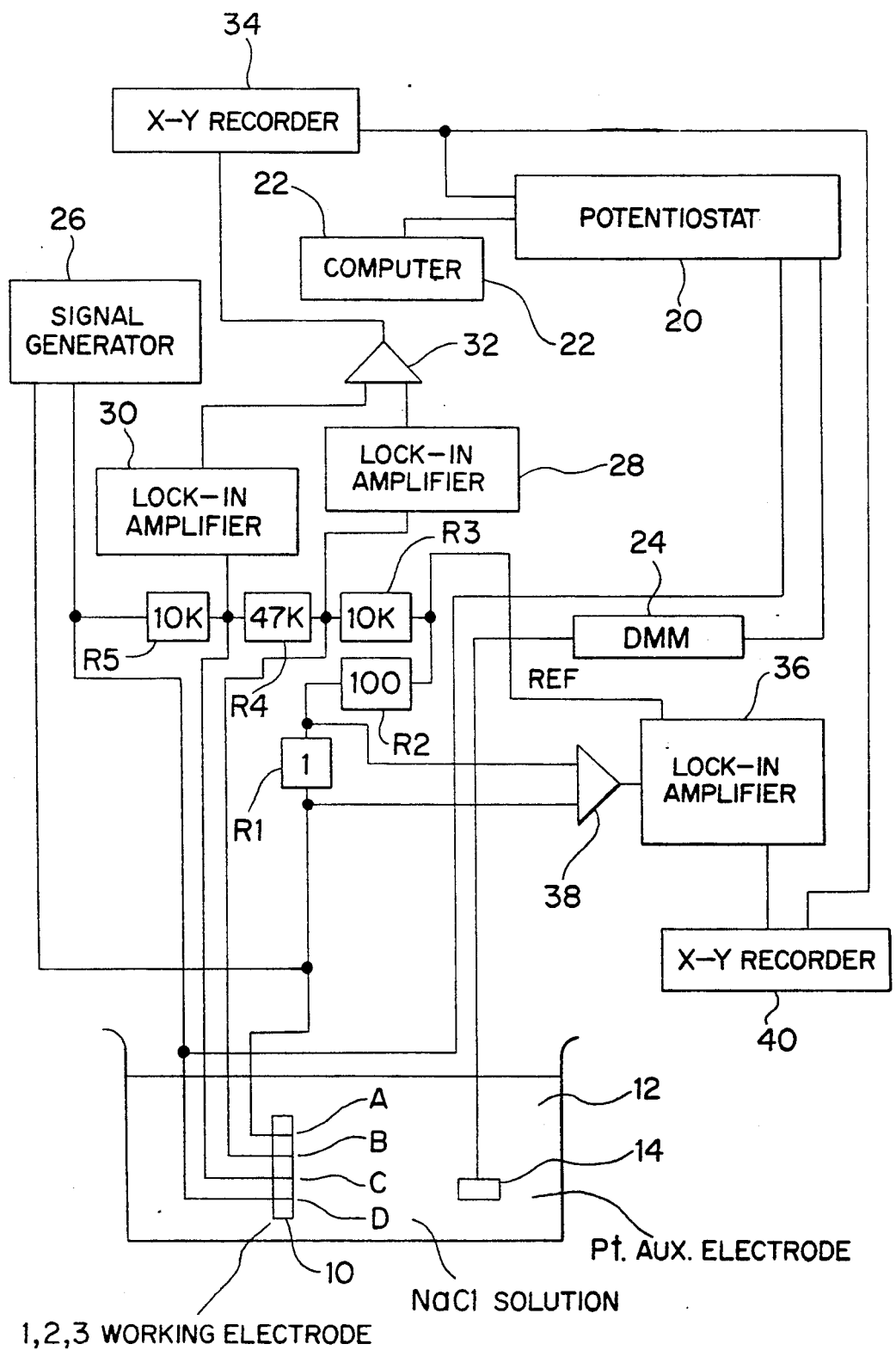
FIG. 1 is a diagram illustrating a method according to this invention with means for measuring electrical resistance.

The apparatus employed for applying an electrochemical potential and measuring the resistivity of the sample is illustrated in FIG. 1. The sample pellet 10 was provided with four ohmic contacts. A, B, C and D using silver paint applied to the ceramic surface and covered with epoxy resin and lacquer. Insulated contact wires were taken from each ohmic contact and the sample pellet inserted in a bath 12 of 0.5M NaCl solution. A platinum electrode 14 was similarly inserted in the electrolyte bath.

A potentiostat 20 under the control of a computer 22 has outputs connected one with the sample contact D and the other, through a digital multi-meter 24, with the auxiliary electrode 14. The sample contact D was also connected with one output of a signal generator 26, the other output of the signal generator being connected with sample contact A. Sample contacts B and C are connected with the inputs of respective lock-in amplifiers 28 and 30, the outputs of these amplifiers being taken to a differential amplifier 32 providing an output to an x-y recorder 34.

Sample contact A is additionally connected through series resistors R1 and R2 with a reference input of another lock-in amplifier 36. Connections made at opposite sides of the resistor R1 form the inputs of a differential amplifier 38 serving to provide an input to the lock-in amplifier 36. The amplifier 36 provides an output to an X-Y recorder 40 with both the X-Y recorder 40 and the X-Y recorder 34 receiving reference inputs from the potentiostat 20. Resistors R3, R4 and R5 are connected respectively across the sample contact pairs AB, BC and CD.

In the method, a small constant current signal of 3.4 mA peak to peak at a frequency of 1053 Hz was applied across the outer sample contacts A and D. The signals appearing on sensing contacts B and C were amplified by the respective lock in amplifiers 28 and 30; with the output signals from these amplifiers being differentially amplified in the amplifier 32. There is thus provided to the X-Y recorder 34 a signal proportional to the difference in amplitude of the two sensing signals and thus, in turn, proportional to the electrical resistance between the contacts B and C. It will be understood that this is a form of four probe measurement.

Figure 2:
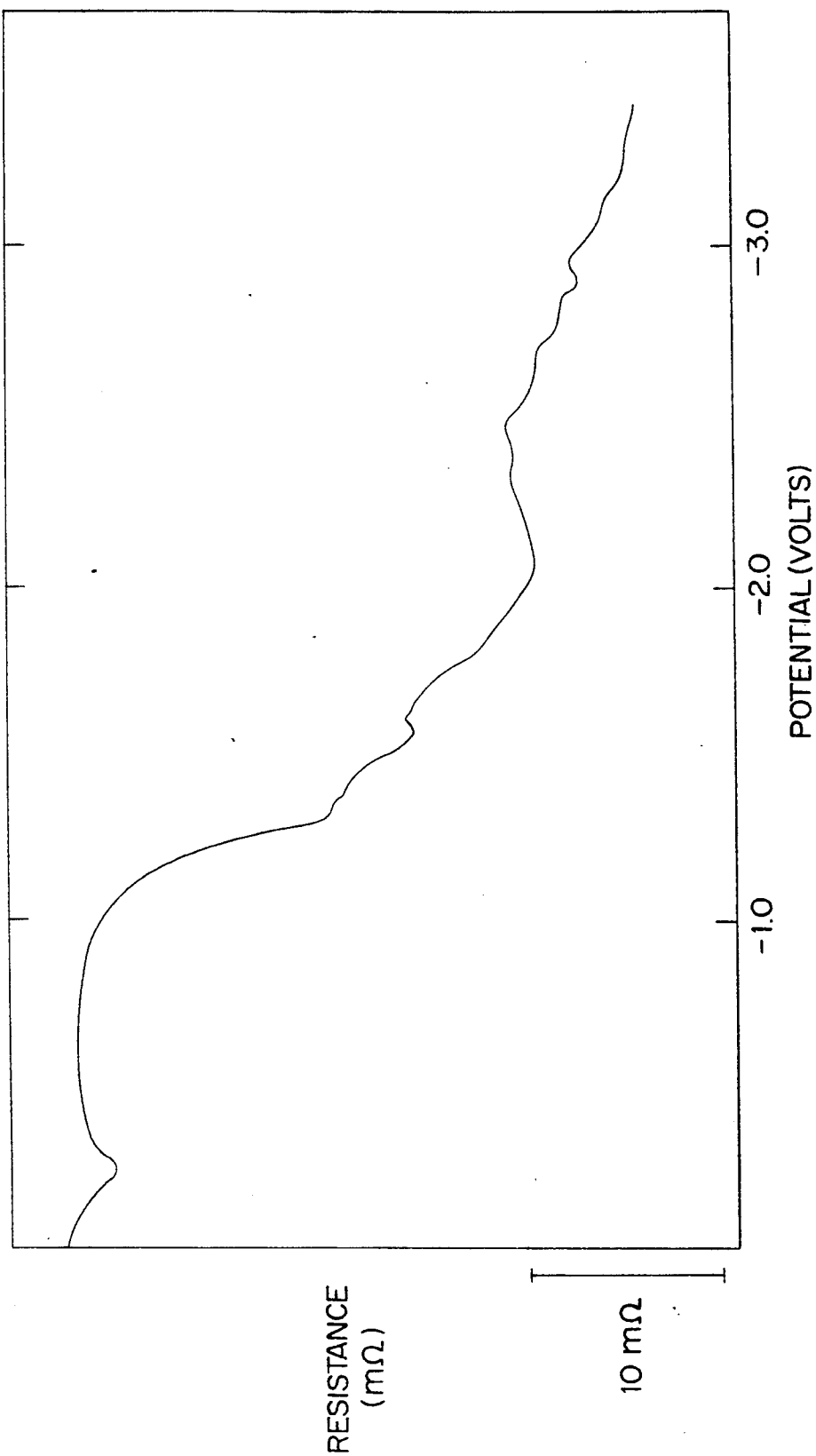
FIG. 2 is a graph illustrating the result of a resistance measurement made by the method illustrated in FIG. 1.

In this manner, the resistivity of the sample was measured as the electrochemical potential—applied form the potentiostat 20 through sample contact D and the platinum auxiliary electrode 14—was scanned at 1000 mV/min. The results achieved are shown in FIG. 2 and it will be seen that as the cathodic bias was increased from zero, the resistance, as measured by the four probe arrangement remains substantially unchanged near 10 mOhms until the electrochemical potential reached about minus 1.2 V, when the resistance began to fall and, at least within the limits of the measuring system, eventually decreased to zero. When the bias was scanned in a positive direction or when the negative DC potential was removed, the AC resistance of the sample returned fairly closely to its original value. For comparison with these results, a series of experiments were performed in which the resistances of ceramic samples prepared in the same way were investigated at temperatures down to 77K using the same four probe measuring arrangement. Instead of being place din the electrochemical cell, the sample was immersed in liquid nitrogen and the loss of resistance as it became superconducting was recorded in the same way. The same samples then returned to the electrochemical cell where the magnitude of the electrochemically induced drop in resistance was found to be comparable with that brought about by immersion in liquid nitrogen. The conclusion drawn was that the cathodic polarisation of the sample induced a reduction in the sample resistance comparable in magnitude to that of the transition to the superconducting state.

Figure 3A:
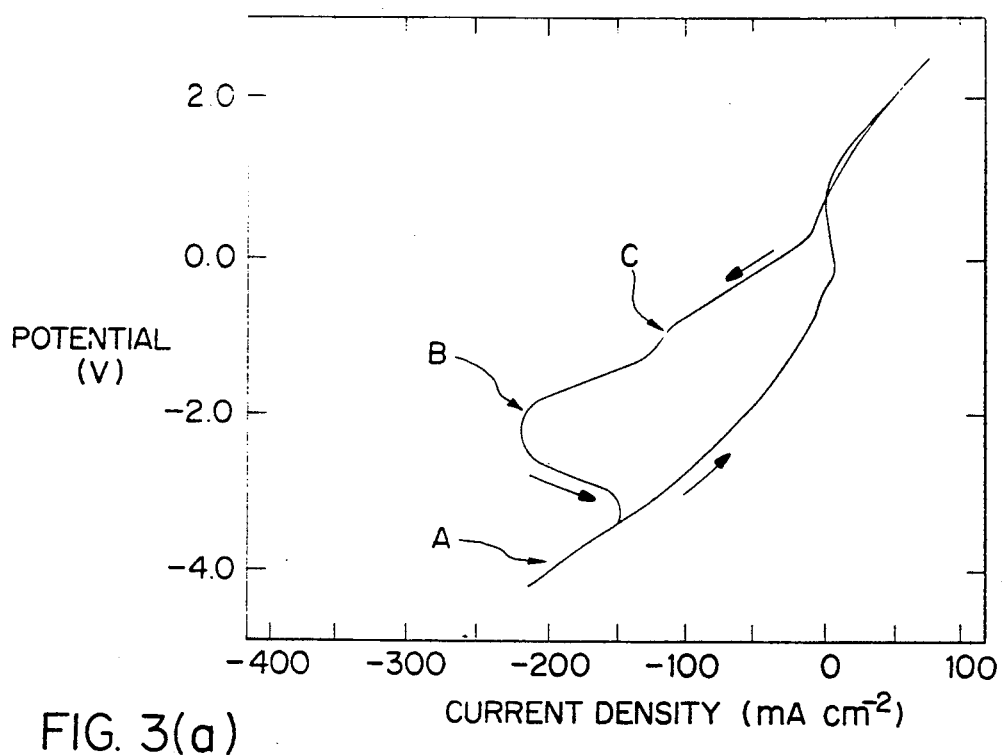
FIGS. 3(a) and 3(b) are graphs showing the results of cyclic voltammetric measurements.
Figure 3B:
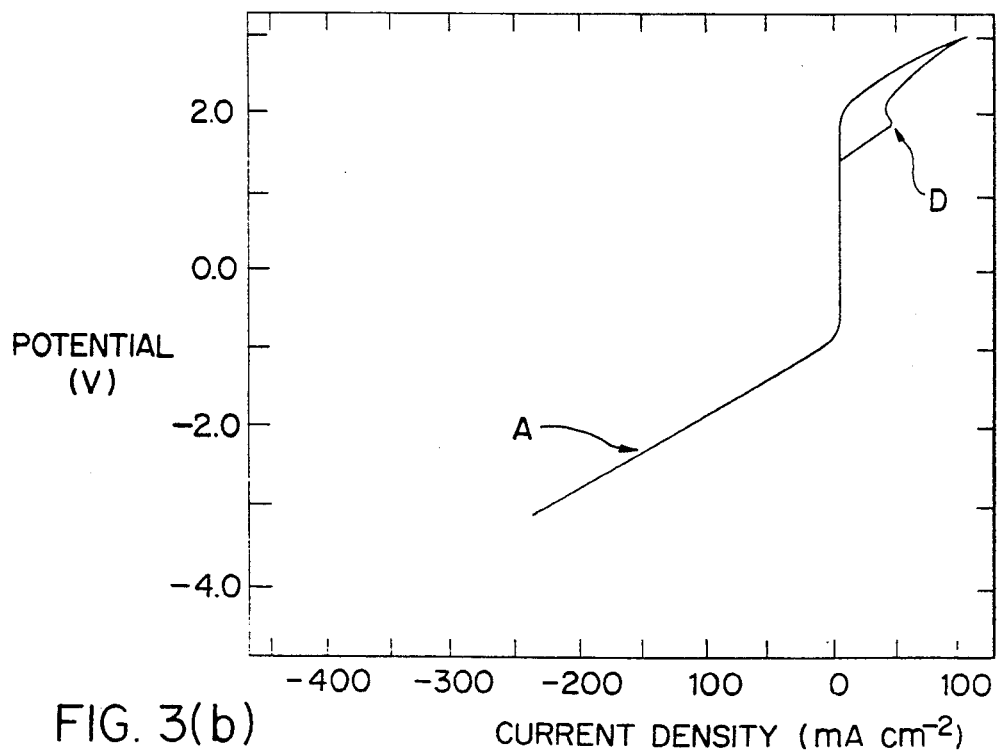

Cyclic voltammetry was used to study the electrochemical reaction taking place during cathodic polarisation of the $YBa_2Cu_3O_{7-x}$ sample. FIG. 3a) shows a typical voltamagram for a $YBa_2Cu_3O_{7-x}$ electrode Vs Pt in 0.5 m NaCl solution. For comparison, FIG. 3b) shows a control voltammoogram for Pt/Pt electrodes in the same solution under identical conditions. The cyclic voltamagram in FIG. 3a) exhibits a wave at point A corresponding to the evolution of hydrogen (see also FIG. 3b), and two pronounced waves at potentials of about minus 2 V and about −0.5 V (points B and C in FIG. 3a) which are clearly associated with the 123 material. In FIG. 3b) apart from the hydrogen evolution at A, the only feature of interest is the wave at point D corresponding to the evolution of chlorine. There is no sign of the waves at B and C as shown in FIG. 3a).

Other workers have obtained similar results and it has been concluded that a high current flux appearing at potentials more positive than the equilibrium potential of the hydrogen evolution reaction can only be correlated with the reduction of the copper oxide components of the superconductor system, since the oxides $Y_2O_3$ and BaO are electrically stable under the experimental conditions. Since both yttrium and barium ions do not generally exhibit mixed valency states and since there was no evidence for the formation of any of the three metallic species, it can be concluded that waves B and C are probably associated with the reduction of copper from higher valency states to copper (I).

The conclusion drawn from the four probe resistance measurement and the cyclic voltammetry is that the conductivity of the 123 compound is strongly influenced by the valency state of the copper ions. It would appear that the electrical resistance of the material becomes extremely low, if not zero, when a sufficiently large proportion of the copper ions are driven electrochemically into the monovalent state. It cannot here be stated with the certainty whether the compound actually becomes superconducting but such a result would be consistent with certain previously proposed models for high temperature superconductivity.

With the previously described arrangement, the superconductor-like behaviour vanishes on removal of the electrochemical potential. This is consistent with re-oxidation of Cu(I) to Cu(II). There will now be described a method by which the superconductor-like behaviour can be arranged to persist.

Using the same electrode arrangement as shown in FIG. 1, the electrolyte was substituted by an aqueous 0.5 ml solution of cupric sulphate at pH 7. A voltage difference of 1.8 V was applied across the working and auxiliary electrodes, with the working electrode being connected to the negative terminal of the supply. Electro-plating of the working electrode was allowed to continue for 2.5 minutes at a constant current density of around 30 mA $cm^{-2}$. It was found that the drop in resistance persisted for a period of a few seconds after removal of the electrochemical potential. It is believed that the metallic copper layer impeded passage of molecular oxygen thus delaying re-oxidation of Cu(I). From this evidence it is believed that, by a suitable encapsulation process in an oxygen-free ambient, it may be possible to render the effect permanent. The encapsulation process may involve electrochemical deposition of material other than copper and an alternative proposal is to arrange for deposition of phenol ions which then polymerise forming an oxygen impermeable encapsulation. In a still further alternative, an aqueous solution of cadmium sulphate or another reducing electrolyte could be employed. Alternatively, a wide variety of other encapsulation techniques could be employed.

There is believed to be a further possible explanation for the persistence of the superconductor-like behaviour in the presence of a metallic copper layer. This is the disproportionation reaction $Cu(II)+Cu(O)=Cu(I)$, whereby the availability of metallic copper is itself a factor in maintaining a population of Cu(I). The possibility exists of using the disproportionation reaction not merely as an adjunct to the electrochemical effect but as a separate and alternative mechanism for maintaining a Cu(I) population. A structure can be envisaged of alternating layers of the described 123 material and metallic copper. Alternatively, random structures providing a mixture of grains of the 123 compound and Cu(O) wold be possible. This may be achieved by modifying the formulation of the starting material and employing appropriate encapsulation techniques. It is known that increasing temperature shifts the equilibrium of the disproportionation reaction towards Cu(I) so that the application of heat might be expected to improve the performance of a superconductor produced in this manner.

As an alternative to maintaining the superconductor-like state by use of an environment preventing oxidation, a structure may be selected which enables an electrochemical potential to be applied continuously or throughout such periods during which superconductor-like behaviour is required. The structure would include an auxiliary electrode, an electrolyte and means for applying a potential between the superconductor compound and the auxiliary electrode.

In a practical arrangement, a non-aqueous electrolyte is likely to be preferred, for example, to avoid corrosive effects. The electrolyte should satisfy the requirements of high stability, high electrical conductivity and inertness (both chemical and electrochemical). It should not involve undue handling difficulties through toxicity for example—and should ideally be inexpensive. The electrolyte may comprise inorganic salts of, for example alkali metals, or organic salts such as aliphatic quaternary ammonium salts, with anions such as halides, perchlorates, nitrates, tetrafluoborates and hexafluoantimonates. Particular examples of useful solutes are sodium and lithium perchlorates. Lewis acids (for example $AlCl_3$ and $BF_3$) $NaPF_6$ or other complex fluorides and complex salts such as $(C_2H_5)_4NClO_4$.

Solvents for the electrolyte are preferably aprotic (that is to say substantially incapable of transferring protons), whether non-polar (for example hydrocarbons and halogenated hydrocarbons) or dipolar (for example ketones, nitriles, amides and sulfoxide). Dipolar aprotic solvents may be protophilic such as dimethylformamide (DMF), dimethylacetamide, dimethylsulfoxide (DMSO), dioxane, pyridine and tetrahydrofuran, or protophobic such as acetonitrile, propionitrile, isobutyronitrile, phenylacetonitrile, benzonitrile and acetone. Still further useful solvents are propylene carbonate, nitromethane, liquid $SO_2$, sulfuryl chloride.

The electrolyte may take a wide variety of physical forms. It may be liquid within a suitable enclosure or held in an appropriate wick structure. Alternatively, the electrolyte may be formulated in paste or gel form. In appropriate cases it will be possible to use a solid electrolyte such as $\beta$ alumina or zirconia stabilised with yttrium, calcium or gadolinium. This may involve operating at elevated temperatures.

A still further possibility is electrolytes in polymer form. An electrolyte as described above can be held in a matrix of, for example, PVC or silicone rubber. A further alternative is to use as the electrolyte an organic metal such a s that based on poly(vinylpyridine) (PVP) or poly(N-vinylcarbazole) (PNVC) with appropriate acceptor molecules. The $PNVC-I_2$ semiconductor has previously been used to produce a solid-state electrochemical cell whilst $PVP-I_2$ has found application in batteries. Both are believed to be of use as electrolytes in the present invention.

There follows a description of a number of applications of the material according to the invention. Whilst, as previously mentioned, it cannot be stated with certainty that the observed effect is superconductivity, the term superconductor is used in this description by way of convenience.

Figure 4:
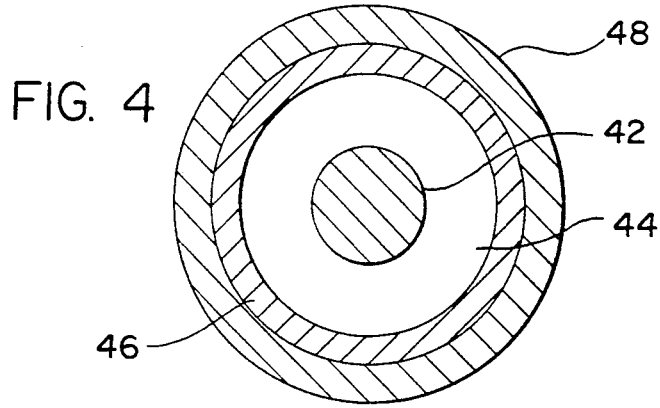
FIG. 4 is a section through a superconductor according to this invention.

Referring to FIG. 4, there is shown in diagrammatic form a superconducting cable structure. The core 42 is formed from the described superconducting ceramic composition and this core is surrounded by a polymer matrix 44 containing an appropriate electrolyte as discussed above. An auxiliary electrode 46, co-axial with the core 42 surrounds the electrolyte matrix and may in turn be surrounded by suitable protective layers shown schematically at 48. The application of a potential difference of around 1.5 V between the core and the auxiliary electrode of the structure, will render the cable superconducting.

Figure 5:
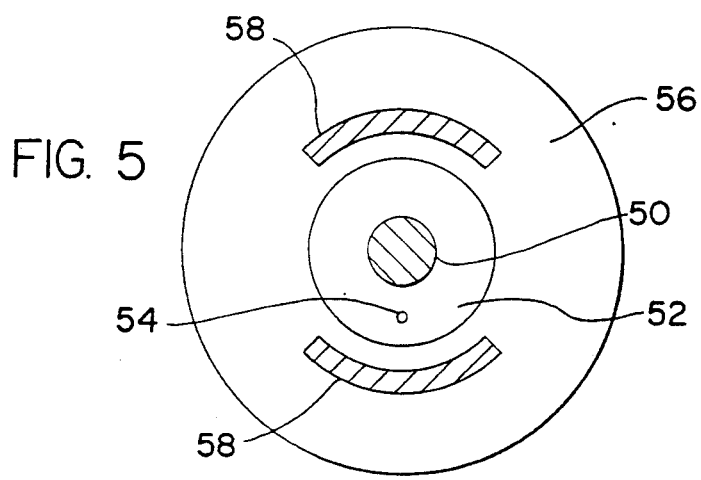
FIG. 5 is a section through a modified superconductor according to this invention.
Figure 6:
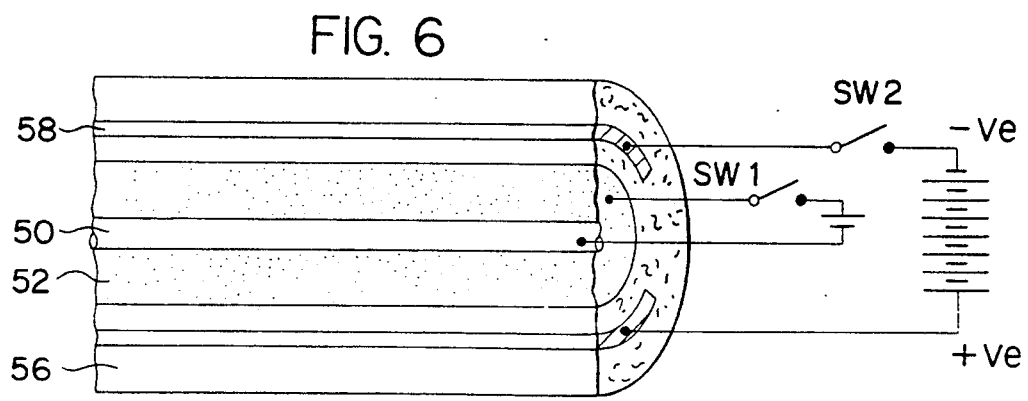
FIG. 6 is a schematic view illustrating terminations of the superconductor shown in FIG. 5.
Figure 7:
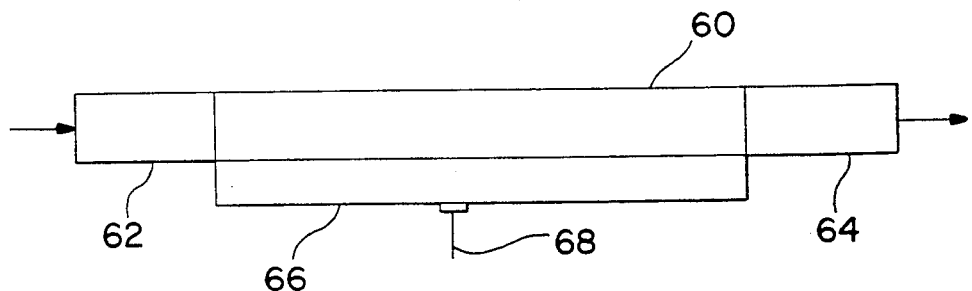
FIG. 7 illustrates in schematic form a control device according to this invention.

By way of further example, reference is made to FIGS. 5, 6 and 7. There is shown in cross section in FIG. 5 a superconducting cable structure having a core 50 of the 123 compound surrounded by an electrolyte supported in a polymer matrix 52. An electrode 54 extends within the electrolyte parallel with the core 50. A sleeve of electrically insulating material 56 surrounds the electrolyte matrix 52 and there are disposed within this insulating material two diametrically opposed field electrodes 58, each of arcuate cross section.

At an appropriate location or locations along the cable, terminations are provided for the switched application of potentials across the described electrodes. These are illustrated schematically in FIG. 6.

As shown in FIG. 6, a switch SW1 may be closed to apply a relatively low potential between the core 50 and the electrode 54. A relatively high potential can be applied across the field electrodes 58 by closing switch SW2.

To initiate superconductivity in the core 50, the switch SW1 is closed to apply an electrochemical potential to the 123 compound in a manner analogous to the previously described embodiment. Switch SW2 is then closed to apply a relatively high potential across the field electrodes 58, thus establishing an electric field at the surface of the core. A suitable field strength is believed to be around $10^5$ V/cm. This field provides—in a surface region of the core the necessary energy to maintain the superconducting state and the switch SW1 can then be opened. It will be understood that in this arrangement the electrochemically induced superconducting effect is largely confined to a surface region, so that the inability of the electric field to penetrate beyond a surface layer does not represent a difficulty. If the superconducting effect is for any reason quenched, it can be re-established by closing the switch SW1 for an appropriate interval.

This arrangement has the advantage that the electrolyte is subjected to electrical stress for only short periods of time and problems of long term electrolyte stability should thereby be reduced.

It would be possible in appropriate cases to initiate the superconducting transition through an electric field, rather than electrochemically. Because of the activation energy required, however, the described hybrid approach is believed to offer significant advantages. In appropriate applications, a planar configuration may be advantageous with field electrodes disposed on either side of a superconducting layer with intervening dielectric layers sufficient to prevent arcing.

Whilst ceramics might normally be regarded as brittle and difficult to work with, techniques have been developed for producing ceramic composition such as the 123 compound in the form of thin filaments which are reasonably flexible and which if necessary can be produced in yarn or even in fabric form. It may in appropriate cases be convenient to adopt manufacturing techniques developed for the aerospace industry. More particularly, techniques have been suggested for manufacturing the 123 compound in the form of a flexible tape and wires approximately 0.3 millimeters in diameter. One approach for producing a superconducting wire is to mix the superconducting ceramic composition with a polymer and then draw the resulting solid out into wire form. The polymer can then be burnt off or otherwise removed to leave a ceramic wire.

Where the application demands shaped forms of the 123 compound, it will be possible to adopt conventional ceramic techniques. A dry powder mixture or a preparation including an appropriate binder can be formed with a variety of fabrication methods. These include hydraulic compaction, isostatic pressing, extrusion, slip casting and injection moulding. It is also possible to use methods resulting in a integral structure of ceramic and metal or polymer. Thus a ceramic slurry can be cast over a polymer substrate to form a mechanically strong sheet, or with integral platinum wire or other electrode arrangements. The above methods will all involve a subsequent sintering stage. An alternative is not isostatic pressing which provides simultaneous sintering.

In order to increase the surface area of the 123 compound, it will in some applications be advantageous to adopt known techniques for producing ceramic foam. Reference is directed in this connection to U.S. Pat. No. 3,893,917, GB 1 537 548 and GB 2 027 688. Using such techniques it will be possible to produce a block of 123 compound having the required shape and dimensions and a large number of internal pores interconnected in a foam like structure. If desired, an electrolyte in fluid form can be introduced into these pores.

As alternatives to described "bulk" manufacturing techniques, it will be possible to adopt a wide variety of known thick and thin film techniques.

It will be possible to build up thin layers of the 123 or other superconducting compound by sputtering. To avoid the build up of surface charges, it will be preferable to employ an RF sputtering technique and these techniques are widely used in the deposition of semiconductor and insulating films. Alternative techniques are screen printing of a paste formed of the ceramic powder and suitable binder; spray pyrolysis; chemical vapour deposition (MOCVD and MOVPE); molecular beam epitaxy; plasma spraying; flame spraying; electro deposition and electrophoresis. The deposited film may be single crystal or multicrystalline with MOCVD and molecular beam epitaxy being preferred for the production of single crystal films.

The substrate can take a wide variety of forms and the optimum substrate will vary according to the application and the deposition technique. Suggested substrates are aluminum oxide in ceramic form; sapphire; silicon; germanium (and other semiconductor materials including Group IIIa and VA compounds); partially stabilised zirconia; sintered MgO; glass ($SiO_2$) or silicon nitride ($Si_3N_4$); steel wires and the like; and metal foils and films. In yet a further alternative a solid electrolyte as mentioned above such a $\beta$ alumina may be used as the substrate with the 123 compound being directly sputtered or otherwise deposited onto the solid electrolyte.

A particularly advantageous use of the deposited films of superconducting composition lies in the field of integrated circuits. Conventionally, the interconnections between devices on a silicon chip are formed in a metallization procedure. According to this invention, the interconnections are formed by a film of superconductor deposited in suitable fashion upon the silicon or other substrate and etched if necessary to produce the desired interconnection array.

This feature would be expected to reduce power dissipation and reduce propagation delay without major changes to existing semiconductor manufacturing equipment and with no need for cryogenics.

Use can be made of the fact that superconductivity is initiated by the application of a potential, to provide various forms of control devices. Referring to FIG. 7, there is shown in schematic form a solid state switch according to this invention. A body 60 of t 6 superconducting composition is provided with terminations 62 and 64. A layer of electrolyte 66 is provided over the superconductor and a gate electrode 68 is provided on the opposing face of the electrolyte. With no potential applied to the gate electrode 68, the superconductor will be in a non-superconducting state with a fixed and known resistance. The application of the potential to the electrode will effect a phase change to the superconducting state with the resistance of the superconductor accordingly vanishing.

The voltage required to operate the described device is very low (1.5 volts) and a very low gate current will be drawn. The superconductor may nevertheless be arranged to carry a relatively high current. The device accordingly has applications in power switching. In an alternative, an array of the described devices can be provided in a control network. It should be understood that by connecting a number of lines to the gate electrode, a NOR gate can be produced and suitable combinations of such NOR gates can be used to provide other logic gate functions.

In order to stabilise the electrical connection between terminations and the superconducting composition, edge regions are doped with cadmium to increase their conventional conductivity. The electrical connection is then made with a region of relatively high conductivity (but not superconducting) rather than with a region that is at times superconducting but at other times of comparatively high resistance.

Figure 8:
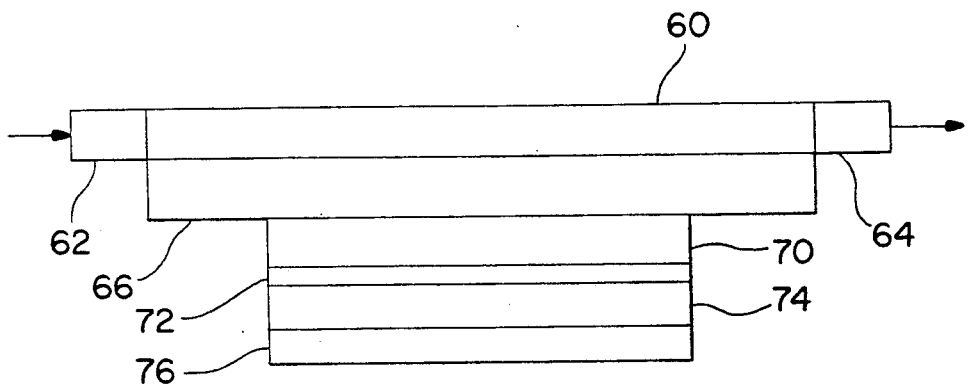
FIG. 8 illustrates in schematic form a modified control device.

A modified control device is shown in FIG. 8. In this case, the gate electrode 68 of the previous embodiment is replaced by an electrode structure comprising a first electrode layer 70 of a metal which is inert with respect to the electrolyte, a second electrode layer 72 of an oxygen getter metal such as Al or Ti, a PTC layer 74 and a third electrode layer 76 of a metal providing the required contact to the PTC material. A potential is continuously applied to the electrode layer 76.

As is well known, the resistance of a PTC material increases sharply at a threshold temperature. Thus, it can be arranged that the potential necessary to initiate the superconducting transition is provided at the switching point of the PTC device. In variations, the PTC device can be replaced by an NTC or other thermistor device or by combinations of such devices to provide a thermal switch having the required temperature dependence. In a more radical modification, the PTC device can be replaced by a photocell or a photovoltaic device (in which case there will no need for an external potential source) to provide an optically sensitive switch. Furthermore the PTC device could be replaced by a pressure sensitive device; still further variations will occur to the skilled man.

In still further control or sensor devices, use is made of the effect on electrolyte performance of parameters such as heat, light flux, acidity and the like.

It is known that Josephson junctions (comprising a thin insulating junction between superconductors) offer the potential of extremely fast-acting logic devices and have useful applications in SQUID's and very high frequency oscillators. Conventional Josephson junction technology of course requires cryogenic equipment and this is in itself a disadvantage. It is also the case, however, that the need to ensure that no junction ever exceeds the superconducting transition temperature imposes design constraints upon the packing, operation and current carrying capabilities of the junctions. Further difficulties have been encountered, particularly in memory cell applications, with variations in current density and thermal hysteresis effects arising from repeated cooling cycles.

Figure 9:
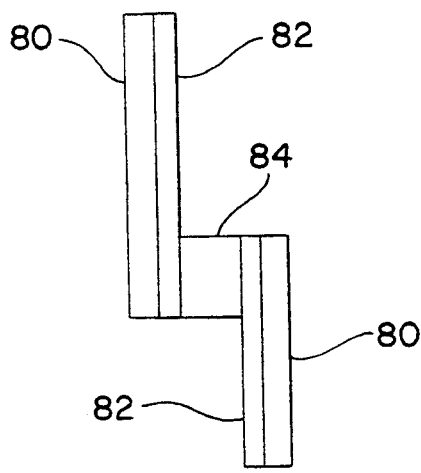
FIG. 9 is a section through a Josephson junction according to this invention.

It is believed that the present invention can overcome or alleviate these problems. With reference to FIG. 9, there is shown a Josephson junction according to the present invention comprising two superconductors 80 each having on their opposing faces a thin layer (a few angstroms) of electrolyte or copper metal 82. Sandwiched between the two conductors is an insulator 84. It is important that the spacing between the two superconductors, that is to say the thickness of the insulator plus the thickness of the two electrolyte or copper metal layers, is small enough to permit tunnelling (less than around 100 angstroms).

With appropriate potentials applied to the electrode layers, the described junction will operate in a manner analogous with conventional Josephson junctions. With the use of a copper layer providing the Cu(I) population by the disproportionation reaction as discussed above, there is of course no need to apply a potential.

Figure 10:
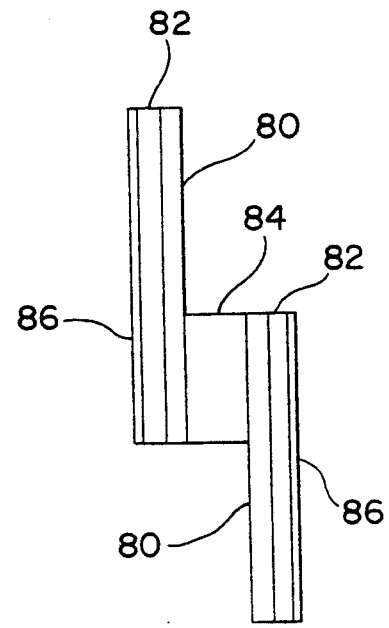
FIG. 10 is a section similar to FIG. 9 illustrating a modification according to this invention.

In an alternative construction shown in FIG. 10, the electrolyte layers 82 are provided on the outer faces of the two superconductors with outer electrodes 86. In this case the thickness of the electrolyte layers ceases to be critical and the tunnelling gap is governed solely by the thickness of the insulator. It is important, however, that the thickness of each superconductor is not greater than the penetration depth of the superconducting transition forced by the electrochemical potential or disproportionation reaction, as appropriate.

This invention will find an application in the broad field of electrical machines. In general terms, the limits of electrical machine size arise from the maximum magnetic field and current that can be achieved. The major limit in practice is formed by the heating produced by the resistance of the materials used in the machine to carry current, either exciting the machine to produce a magnetic field B or to produce an armature mmf. The limit on the output of the machine is important not only for very large machines because the size, inertia and weight (and derived from these parameters the cost) of the machine can be crucial in the microwatt range as much as in the Gigawatt range.

Previous superconducting machines have required that the conductors be cooled to extremely low temperatures. As well as the obvious engineering difficulties that this brings, the cost of the cryogenic plant required reduces the range of cost effective applications to very large machines. The economic break even point has generally been seen to be in the region of 1000 MW and at this size the market was restricted to the large synchronous generators used by the electric power utilities.

It is believed that superconductors according to the present invention can be used to considerable advantage in a wide range of electrical machines.

One application lies in the field excitation of machines such as DC motors or generators, synchronous machines (motors, generators, synchronous condensors), solonoids, actuators, magnetic levitation and magnetic separators. The synchronous machine applications need not be rotational. For instance, an application of interest would be the combination of a linear synchronous machine with magnetic levitation for traction applications. In conventional machines it is necessary to use ferromagnetic material to reduce the mmf requirement to drive flux around the magnetic circuit. In addition to obvious weight and cost disadvantages, the use of, for example iron imposes an upper field limit corresponding to saturation of the iron. In practical terms this often involves an upper limit of about 1 Tesla. Ferromagnetic materials having a higher saturation level are under consideration but are considerably more expensive than iron and do not remove the weight and size problems. A machine using a superconducting field wiring in accordance with this invention would be capable of operating without an iron core and is thus capable of providing much higher flux levels. Because of the lack of an iron core and also the use of relatively small amounts of superconductor in place of heavy copper windings, it will enable the size of a machine for a given output to be dramatically reduced. As compared with existing proposals for superconducting machines, the present invention will avoid the need for cryogenic equipment, thus reducing cost and size still further.

Particular applications are thought to lie in aerospace where reductions in weight produce very large cost benefits, robotic devices and traction (particularly maglev applications). In robotic equipment, the low carrying ability of the device is severely limited by the weight of the machines which are used to drive the robotic manipulator. Use of the present invention would be expected to produce a large saving in weight and hence a gain in performance without cryogenic complications which might otherwise have rendered the use of superconductivity impractical. The use of an ironless aperture design for robotic actuators would also be expected to provide a significant decrease in inertia thus improving the response time of the robotic device. With regard to maglev applications, a major problems hitherto has ben the weight of the machine and the requirement for cryogenic equipment. Use of the present invention removes or alleviates both these problems and would permit superconducting components to be used easily on board the vehicle itself. The levitation/suspension mechanism could be via a field coil or by exploiting the Meissner effect. Of particular potential benefit is the combination of the levitation machine with the traction machine, for instance using a linear synchronous machine.

A particularly important application of superconducting cables may lie in power transmission. Thee is felt to be a need to improve upon present AC methods of transmitting electrical power from such standpoints as cost and also avoidance of stray electromagnetic fields. High voltage DC (HVDC) transmission has been suggested as a solution to these problems. Lacking the problems with capacitance that are associated with AC cables, HVDC can economically employ cables rather than overhead lines. Another critical advantage is the fact that they are not synchronous links so that connections can be made between power systems which are not synchronous one with the other (for example between two countries). The problem associated with HVDC is that both generation and use of electrical power is far economic in AC form so that HVDC lines must be accompanied by a rectifier at the generator and an inverter at the user. Current semiconductor devices currently employed to rectify and invert are limited in their voltage capability and HVDC transmission therefore generally takes place at relatively low voltage and high current. The use of superconductors according to the present invention will offer considerable advantages in such cables. Moreover, the described manner in which the superconducting transition can be controlled by an application of a potential should permit direct rectification and inversion.

There seem to be a wide range of applications for superconductor magnets according to this invention, such applications including tokomak magnets, magnetohydrodynamics (MHD) generators, particle research and medical diagnostic and therapeutic equipment.

Magnetic separators, magnetic bearings and fault current limiters are other examples in which the advantages of the present invention provides over conventional superconducting field coils are likely to be of considerable practical importance. In a magnetic separator, a high magnetic field is produced and a stream containing ferromagnetic and/or conducting particles which require separation is forced through the field. Magnetic bearings could employ a superconducting field coil or the Meissner effect. Fault limiters employ the increase in inductance which occurs when an iron cored inductor is driven out of saturation by a large fault current. In the normal state, the iron coil or the fault limiter is held in saturation by a large mmf. This only really becomes viable if the large source of mmf can be provided easily and this is where the present invention would offer significant advantage.

In addition to the advantages the present invention provides in broadly conventional equipment by providing superconductivity without the need for cryogenic equipment, the present invention itself provides a number of new machines.

One such new machine is a commutatorless DC machine having an armature winding formed of a series of superconductors, for example taking the form shown in FIG. 4. The excitation could be provided by a superconducting field coil according to this invention or a permanent magnet. The potential applied to the auxiliary electrodes of the superconducting armature windings are switched such that each conductor is only carrying its full current in one half of the cycle. By removing the electrochemical potential in the other half cycle, the superconductor reverts to a non-superconducting state in which the small current that it would carry is expected to have only a minor effect of the operation of the machine.

Figure 11:
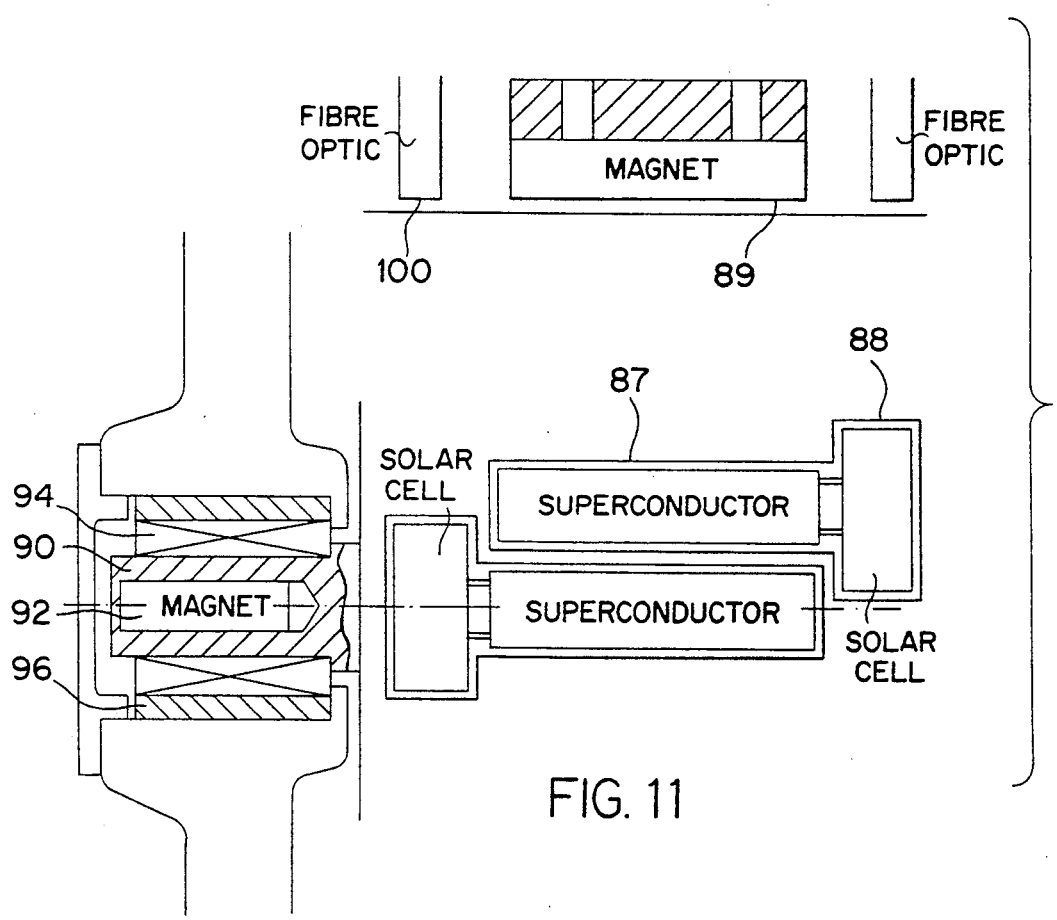
FIG. 11 is a perspective and somewhat schematic view of a motor according to this invention.

A further novel machine will now be described with reference to FIG. 11 which shows a motor operating on the Meissner effect. The rotor of the machine comprises an array of superconductors 87 in squirrel cage formation. Each superconductor has at its end an integral photovoltaic device 88 so connected as on illumination to supply a potential to the superconductor to effect the superconducting transition. There is arranged axially around the rotor an array of permanent magnets 89 as shown in FIG. 11. Each magnet extends axially and is of U-shaped section.

The rotor is mounted on suitable bearings. The end of the rotor shaft 90 includes a small permanent magnet 92 and outside a conventional bearing 94 there is provided a sleeve 96 of superconducting material. By virtue of the Meissner effect, the shaft is to a degree magnetically supported with the conventional bearing 94 providing standby support.

Light from appropriate source, typically sunlight, is collected by lenses and funnelled through optical fibers 100 to the photovoltaic devices 88. It will be recognised that on rotation of the rotor the photovoltaic devices are alternatively energized and de-energized. Referring now to FIG. 11, and considering for simplicity one pair of adjacent superconductors 87, it will be understood that the Meissner effect will tend to displace one superconductor 87 radially. No force is exerted on the neighboring superconductor 87 since this is in the non-superconducting state. By arranging that each superconductor is activated as it passes the center line of a magnet, continuous rotation of the motor can be achieved.

It is believed that a motor operating as described can in certain applications provide considerable advantages. The motor is mechanically straightforward and could be expected to operate for extended periods of time without maintenance. It is lightweight and should be inexpensive to manufacture. Because of low working temperatures, it should be possible to utilise plastic materials, thus further reducing weight, inertia and costs. It would be appropriate to employ conventional plastic magnets. Whilst the use of fiber optics is believed to offer considerable advantages, particularly but not exclusively in solar applications, other forms of switching could be employed. It will further be apparent to the skilled man that the same techniques can be employed to produce a generator.

Figure 12:
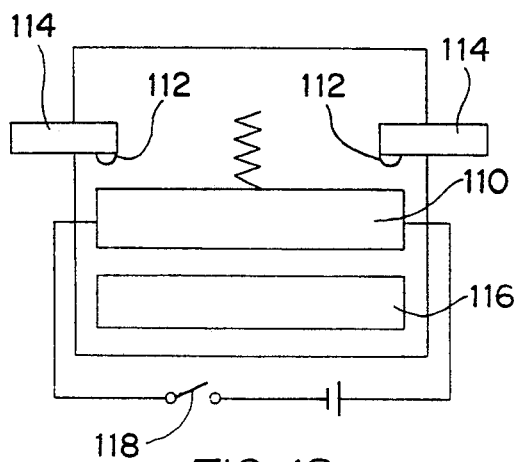
FIG. 12 is a diagram of a magnetic relay according to this invention.
Figure 13:
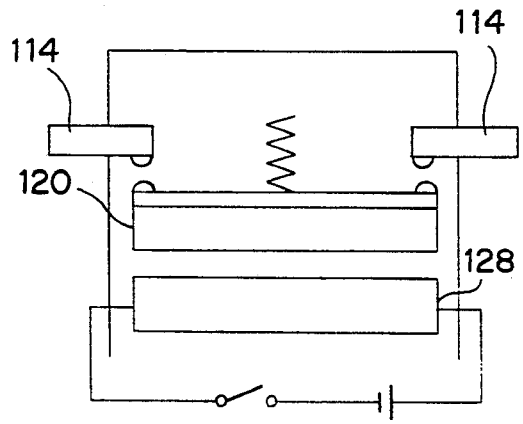
FIG. 13 is a diagram of a modified relay according to this invention.

An alternative application of the Meissner effect of superconductors according to this invention lies in magnetic actuators and magnetic sensors. With reference now to FIG. 12, the example is taken of a magnetic relay. A superconductor bridge piece 110 is biassed away from contacts 112 provided on terminations 114. A permanent magnet 116 is positioned adjacent the superconductor such that upon closing of the switch 118 to apply a potential to the bridge piece 110 and thereby render it superconducting, the Meissner effect causes the bridge piece to move toward and to close the contacts. In a variation illustrated in FIG. 13, the bridge piece 120 carries an integral permanent magnet, whilst the superconductor 128 is mounted in a fixed position.

Whilst the examples given above all relate to the electrochemical reduction of CU(II) to CU(I), it should be understood that there are a variety of alternative techniques by which this same transition can be forced at temperatures well above the inherent superconducting transition temperature. The ceramic composition may, for example, be maintained in a suitable reducing ambient (for example, H$_2$, CO or forming gas) and heated if necessary. The ceramic composition may be treated in a reducing plasma or with such a technique as argon beam etching. The reducing agent may be mixed intimately with the ceramic composition. In one such arrangement, crystals of the 123 or other ceramic composition are held in a reducing matrix produced by firing the mixture in an inert or partially reducing atmosphere containing for example antimony or cadmium. To avoid the need to maintain the composition in contact with the reducing agent of whatever form, an encapsulation technique, as proposed above, may be used to prevent re-oxidation. It may indeed be possible to produce a ceramic composition in which the copper ions are ab initio in the CU(I) state. For example, cuprous oxide may be used in the original formulation in place of cupric oxide.

It is not necessary for the entire population of copper ions in the composition to be converted form the CU(II) state to the CU(I) state in order to effect superconductivity. It will be recognised that a single superconducting path through regions of the composition where the conversion has been effected will short-circuit non-superconducting regions of the composition. In many cases, the regions which are rendered superconducting will be surface regions. Increasing the population of the CU(I) state would be expected to increase the critical current of the superconductor, that is to say, the maximum current which can be carried before this superconducting effect is lost.

As mentioned previously, there are a variety of known "high-temperature" superconductors which have within the crystal structure planes containing copper and oxygen ions only. This invention is regarded as broadly applicable to that group. More particularly, the invention is regarded as applicable to ceramic compositions of the formula:

$$\alpha\beta_2Cu_3\delta_{7-x}$$

where $\alpha$ represents a trivalent metal atom or a plurality of different trivalent metal atoms; the $\beta$'s, which may be the same or different, each represents a divalent metal atom or a plurality of different divalent metal atoms and the $\delta$'s, which may be the same or different, each represents oxygen, sulphur or halogen. Preferably, the or each $\alpha$ is a metal of Groups IIIa, IIIb or of the lanthanide series and the or each $\beta$ is a metal of Group IIa.

There further exists the possibility of inducing the necessary electronic configuration in the $\alpha\beta_2Cu_3\delta_{7-x}$ compound by appropriate doping. For instance, the or each $\alpha$ can be replaced partly by a Group IV A element. The or each $\beta$ can alternatively be replaced by a Group III A element. In both cases it is essential that electrical neutrality is retained. This represents a technique for ensuring without an outside agency that a population of Cu(I) is maintained.

It will be appreciated that the stoichiometry of the composition will generally be such that the ratio of total number of atoms $\alpha$: total number of atoms $\beta$: total number of Cu atoms is approximately 1:2:3, irrespective of whether $\alpha$ and $\beta$ represents respectively a single trivalent metal atom or a plurality of different trivalent metal atoms or a single divalent metal atom or a plurality of different divalent metal atoms.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A ceramic material containing copper, comprising the copper being maintained substantially independently of temperature in an oxidation state providing a significant population of Cu(I), so that the material exhibits superconductivity or superconductor-like behaviour at temperatures above 200° K. wherein Cu(II) is reduced electrochemically to Cu(I).

2. A material according to claim 1, wherein the material comprises the Perovskite structure.

3. A material according to claim 1, wherein the material comprises a crystal structure with planes which comprise substantially only copper and oxygen.

4. A ceramic material according to claims 1, 2 or 3, having the structure:

$$\alpha\beta_2Cu_3\delta_{7-x}$$

where $\alpha$ represents a trivalent metal atom or a plurality of different trivalent metal atoms; the $\beta$'s, which may be the same or different, each represent a divalent metal atom or a plurality of different divalent metal atoms and the $\delta$'s, which may be the same or different, each represents oxygen, sulphur or halogen.

5. A material according to claim 4, where an $\alpha$ is a metal of Group IIIa, IIIb or of the lanthanide series and $\beta$ is a metal of Group IIa.

6. A material according to claim 4, wherein $\alpha$ is selected from the group consisting of Y, La, Bi and Tl; $\beta$ is selected from the group consisting of Ba, Sr and Ca; and $\delta$ is oxygen.

7. A material according to claim 1, wherein a potential is continuously applied to the material.

8. A material according to claim 1, provided with means for maintaining an environment which inhibits or prevents oxidation.

9. A material according to claim 8, wherein the material is encapsulated to exclude molecular oxygen.

10. A material according to claim 9, wherein an encapsulating layer is electroplated on the material.

11. A method for use with a composition which exhibits superconductivity below a superconducting transition temperature, comprising the steps of:
maintaining at least a proportion of a metallic species in the composition in a reduced state; and
causing the composition to exhibit superconductivity or superconductor-like behaviour thereby at a temperature significantly in excess of the superconducting transition temperature.

12. A method according to claim 11, wherein said metallic species comprises copper.

13. A method according to claim 11, or claim 12, comprising the step of contacting the composition with a reducing agent.

14. A method according to claim 13 wherein said reducing agent comprises a gas.

15. A method according to claim 13, wherein said reducing agent comprises a plasma.

16. A method according to claim 13 wherein said reducing agent is mixed with said composition.

17. A method according to claim 11 or claim 12, further comprising the step of applying a sufficient electrochemical potential to the composition to reduce said metallic species.

18. A method according to claim 17, further comprising the step of maintaining the composition in an environment inhibiting oxidation of the metallic species.

19. A conductor exhibiting superconductivity or superconductor-like behaviour at room temperature and comprising a ceramic composition containing a reduced metal species maintained in an environment serving to prevent or inhibit oxidation of said species wherein said ceramic composition is encapsulated to exclude molecular oxygen.

20. A conductor according to claim 19, wherein said metal species comprises copper.

21. A conductor according to claim 19 or claim 20, wherein said ceramic composition comprises a crystal structure with planes containing substantially only copper and oxygen.

22. A conductor according to claims 19 or 20, wherein said ceramic composition comprises the Perovskite structure.

23. A conductor exhibiting superconductivity or superconductor-like behaviour at room temperature and comprising a ceramic composition being the negative electrode of an electrochemical cell.

24. A conductor according to claim 23, wherein the ceramic composition comprises a crystal structure with planes containing substantially only copper and oxygen.

25. A conductor according to claim 23 or claim 24, wherein the ceramic composition comprises the Perovskite structure.

26. A conductor according to claims 23 or 24, wherein the ceramic composition comprises a form which in the absence of an electrochemical potential becomes superconductive on lowering of temperature beneath a superconductor transition temperature.

27. A conductor according to any one of claims 23 or 24, wherein the ceramic composition comprises an elongated form, and further comprising a co-extending auxiliary electrode and an electrolyte disposed between the ceramic composition and said auxiliary electrode.

28. A method for use with a composition which exhibits superconductivity below a superconducting transition temperature, comprising the steps of:
contacting the composition with a reducing agent;
maintaining at least a proportion of a metallic species in the composition in a reduced state; and
causing the composition to exhibit superconductivity or superconductor-like behaviour thereby at a temperature significantly in excess of the superconducting transition temperature.

29. A method according to claim 28, wherein said metallic species comprises copper.

30. A method according to claim 28, wherein said reducing agent comprises a gas.

31. A method according to claim 28, wherein said reducing agent comprises a plasma.

32. A method according to claim 28, wherein said reducing agent is mixed with said composition.

33. A method according to claim 28, further comprising the step of applying a sufficient electrochemical potential to the composition to reduce said metallic species.

34. A method according to claim 33, further comprising the step of maintaining the composition in an environment inhibiting oxidation of the metallic species.

* * * * *